(12) United States Patent
Natarajan et al.

(10) Patent No.: US 6,261,927 B1
(45) Date of Patent: Jul. 17, 2001

(54) METHOD OF FORMING DEFECT-FREE CERAMIC STRUCTURES USING THERMALLY DEPOLYMERIZABLE SURFACE LAYER

(75) Inventors: Govindarajan Natarajan, Pleasant Valley; Richard F. Indyk, Wappingers Falls; Vincent P. Peterson, Poughkeepsie; Krishna G. Sachdev, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,943

(22) Filed: Apr. 30, 1999

(51) Int. Cl.$^7$ .................................................. H01L 21/30
(52) U.S. Cl. ..................... 438/455; 438/458; 438/465; 438/781; 438/976
(58) Field of Search ...................... 438/455, 458, 438/FOR 104, 465, 780, 781, 976

(56) References Cited

U.S. PATENT DOCUMENTS 5,746,874   5/1998   Natarajan et al. .
5,785,800 * 7/1998   Natarajan et al. .

FOREIGN PATENT DOCUMENTS 2-12894  *  1/1990  (JP) .

* cited by examiner

*Primary Examiner*—George Fourson
*Assistant Examiner*—Michelle Estrada
(74) *Attorney, Agent, or Firm*—Margaret A. Pepper

(57) ABSTRACT

This invention relates generally to a new method of forming semiconductor substrates with defect-free surface metallurgical features. In particular, the invention related to a method for providing surface protected ceramic green sheet laminates using at least one thermally depolymerizable surface layer. More particularly, the invention encompasses a method for fabricating semiconductor substrates wherein a thermally depolymerizable/decomposable surface film is placed over a ceramic green sheet stack or assembly prior to lamination and caused to conform to the surface topography of the green sheet during lamination. The invention also encompasses a method for fabricating surface protected green sheet laminates which can be sized or diced without causing process related defects on the ceramic surface. After lamination the thermally depolymerizable/decomposable film is conveniently and cleanly removed due to thermal depolymerization and burn-off of volatile species during the sintering process, thus providing surface defect-free ceramic substrates.

19 Claims, 2 Drawing Sheets

METHOD OF FORMING DEFECT-FREE CERAMIC STRUCTURES USING THERMALLY DEPOLYMERIZABLE SURFACE LAYER

FIELD OF THE INVENTION

The present invention relates generally to a method and a structure for forming semiconductor substrates, and particularly relates to improvement in ceramic manufacturing process and structure for the production of ceramic packages using at least one thermally depolymerizable surface layer. More particularly, this invention relates to ceramic green laminate processing and structure using at least one protective overlay that adheres to at least a portion of the green ceramic surface to provide reduction/elimination of defects caused during processing, such as, handling and sizing/dicing operations.

BACKGROUND OF THE INVENTION

Semiconductor substrates and devices are becoming smaller and more dense with the evolution of new technologies. However, increase in circuit density produce a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which effect both yield and reliability. Historically, screening techniques have been employed to improve product failure rates to acceptable levels by culling out many of these random defects.

In their desire to improve their products, the semiconductor manufacturers are constantly finding new ways and new techniques to improve or provide new products. Semiconductor substrates or ceramic chip carriers generally are made with a planar surface having a flat chip site for mounting the semiconductor device. The substrates are often referred to as modules which can be made from a single ceramic layer or green sheet forming a single layer ceramic module or a plurality of ceramic layers could be used to form a multilayer ceramic (MLC) module.

While the remaining discussion will be directed to MLC modules, it should be understood that the teachings of the present invention can be equally applicable to single layer modules.

MLC modules are normally used in the electronic industry to package high performance integrated circuits or chips (hereafter just chips). These high performance chips have a large number of external inputs/outputs (I/Os), such as pads or solder balls, to name a few, and these chips have a very high power dissipation requirement. In order to accommodate such high performance chips, the MLC module also has to provide a high number of external I/Os, such as pads, pins, solder balls, to name a few, and also be able to handle the very high power dissipation both from the module as well as the chip.

Standard process for ceramic substrate production involves green sheet casting of ceramic slurry comprising ceramic filler, organic binder, solvent vehicle and plasticizer dispersion, blanking, via punch, circuit personalization or screening of conductive paste through a screen mask, singulation/sizing, inspect/collate/register, stack and lamination, binder burn-off and sintering operations. In the handling of green laminates especially sizing and dicing operations, flying ceramic debris generally falls on the surface layer which gets embedded in the ceramic during subsequent processing, such as, the sintering process. Such defects in the ceramic substrates are undesirable and thus significant number of sintered substrates have to be reworked or discarded causing additional expenses and/or product yield losses.

The present invention, however, solves this problem by the use of a thermally depolymerizable/decomposable surface film or layer that protects the green ceramic surface during lamination, and also serves as a sacrificial protective layer against any flying ceramic debris during handling and sizing/dicing operations. However, the protective layer is preferably made from a material that decomposes and burns off during the sintering cycle.

PURPOSES AND SUMMARY OF THE INVENTION

The present invention is a novel method and structure for providing at least one sacrificial protective polymer adhesive layer over a green sheet laminate in order to minimize and/or eliminate processing defects. The surface protective film preferably comprises of at least one thermally depolymerizable polymer which cleanly burns off during the sintering cycle.

Therefore, it is a purpose of the present invention to provide an improved method for semiconductor substrate production without causing damage or defects to the ceramic body or causing paste pull-outs.

Another purpose of the present invention is to provide a thermally decomposable surface film, which film avoids any damage to the ceramic body and/or causes any paste pull-outs.

Yet another purpose of this invention is to provide a novel thermally depolymerizable/decomposable adherent surface film as a protective layer in the ceramic green laminates production to reduce and/or eliminate processing defects.

Still yet another purpose of the invention is to provide a novel thermally depolymerizable/decomposable adherent surface film as a protective layer in the ceramic green laminates production to reduce and/or eliminate processing defects caused during lamination, handling, and/or sizing/dicing operations.

Therefore, in one aspect this invention comprises a method of protecting an unsintered structure having at least one defect-free surface feature, comprising:

(a) placing at least a portion of at least one thermally depolymerizable/decomposable layer over said surface feature on said unsintered structure, wherein said thermally depolymerizable/decomposable layer has the characteristics of being thermally bondable to at least a portion of said unsintered structure and to at least a portion of said surface feature on said unsintered structure during lamination and being thermally decomposable without leaving any carbonaceous residue during subsequent sintering;

(b) applying pressure onto at least a portion of said thermally depolymerizable/decomposable layer, such that at least a portion of said thermally depolymerizable/decomposable layer conforms to at least a portion of the surface topography of said surface feature and said unsintered structure, and wherein at least a portion of said thermally depolymerizable/
decomposable layer further adheres to at least a portion
of the surface of said unsintered structure, and thereby
protects said unsintered structure.

In another aspect this invention comprises an unsintered
structure comprising at least one semiconductor substrate
having at least one metallized feature and at least a portion
of at least one thermally depolymerizable/decomposable
layer conformably secured to a portion of said metallized
feature and said at least one semiconductor substrate.

BRIEF DESCRIPTION OF THE DRAWINGS

The features of the invention believed to be novel and the
elements characteristic of the invention are set forth with
particularity in the appended claims. The drawings are for
illustration purposes only and are not drawn to scale.
Furthermore, like numbers represent like features in the
drawings. The invention itself however, both as to organization and method of operation, may best be understood by
reference to the detailed description which follows taken in
conjunction with the accompanying drawings in which:

DETAILED DESCRIPTION OF THE INVENTION

Figure 1:
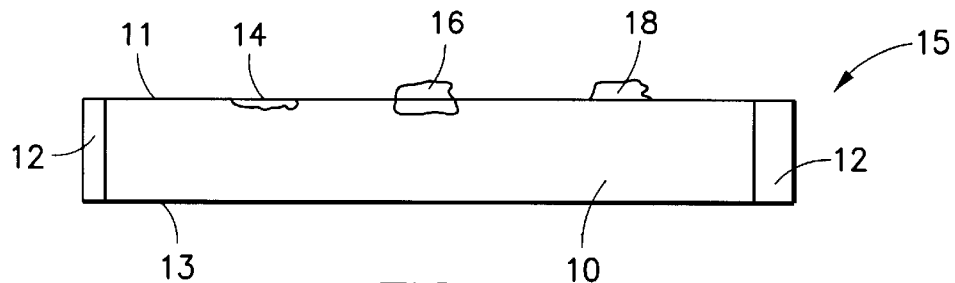
FIG. 1, illustrates the problem of debris being fused on to
an unsintered green ceramic laminate during processing.

As shown in FIG. 1, a sintered or unsintered substrate 15,
typically a ceramic substrate 15, comprises one or more
individual ceramic sheets or layers 10, having a top surface
11, and a bottom surface 13. The sheets 10, typically have a
frame-like area 12, which in most cases is made from the
same material as the material for the sheets 10. The area 12,
in most cases is an extension of the sheets 10, and the area
12, may be used for non-functional activity or features. It has
been discovered that when the sheets 10, are processed,
particles or debris 14, 16 and/or 18, gets lodged onto the
surface of the substrate 15. As shown in FIG. 1, the debris
14, is lodged inside the ceramic sheets 10, the particle 16, is
both below and above the surface 11, while particle 18, is on
the surface 11, of the substrate 15. Because some particles
may be loosely lodged into the surface 11, of the substrate
15, it might be easier to dislodge and blow-away the
particles, such as, particle 18, by means well known in the
art. However, other particles, such as, particles 14 and 16,
may be a little more difficult to dislodge or remove from the
surface 11, as they could be fully or partially embedded into
the surface of the ceramic layer 10. One way to remove the
particles 14, 16 and/or 18, could be through any of the
known polishing techniques, however, that would add additional processing steps and may affect the thickness of the
layer 10 or substrate 15.

The debris 14, 16 and/or 18, could have been lodged on
top of the surface 11 and 13, for a variety of reasons. For
example, it is a common practice in MLC industry to green
size laminates, such as, by using a diamond saw. During
such sizing operation, generally ceramic debris is generated
which debris settles and adheres to the top of the surfaces 11
and 13, of the substrate 15. The green sizing process is such
that the debris at the moment of production is hot due to high
speed cutting of the green ceramic body 15. The temperature
of such debris 14, 16 and 18, at the moment of being ejected
is far greater than the glass transition temperature of the
polymer binder in the green sheet stack 10. Therefore, the
debris 14, 16 and/or 18, upon settling on the substrate 15,
would tend to fuse with the material on the surfaces 11
and/or 13, of the substrate 15. In such instances the debris
14, 16 and/or 18, gets sintered and results in as fused
ceramic particles 14, 16 and/or 18, on the surface 11 and/or
13, as well as on top of any metallurgy that may be present.
This fusion of the particles 14, 16 and/or 18, causes serious
problem in post-sinter operations, such as, plating, surface
mounting, etc. These substrates 15, with fused material 14,
16 and 18, would of course be rejected as they would
directly impact the product yields and production cost.

Figure 2:
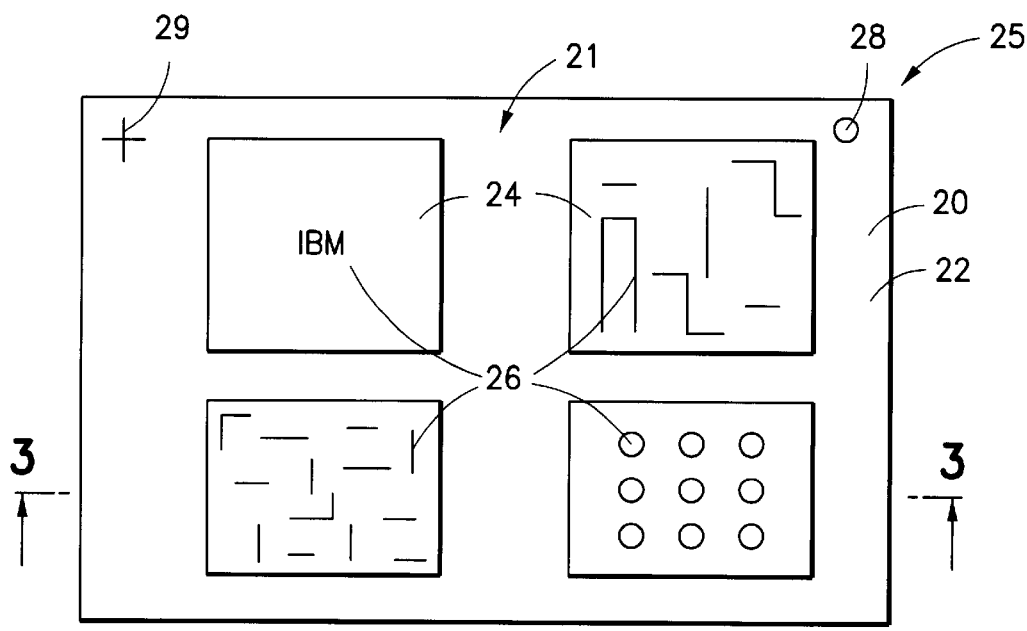
FIG. 2, illustrates a plurality of unsintered ceramic green
sheet with multiple substrate pattern punched and screened.
Figure 3:
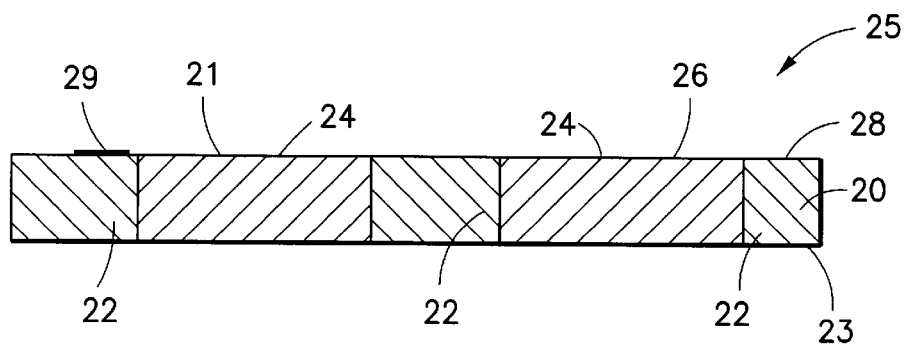
FIG. 3, illustrates a cross-sectional view taken along
3—3, of FIG. 2, showing the stack of unsintered ceramic
green sheets, which have been metallized, stacked or
assembled, aligned and laminated.

Now referring to FIGS. 2 and 3, where FIG. 2, illustrates
an unsintered substrate 25, that has one or more ceramic
green sheets 20. As illustrated at least one green sheet 20,
such as, thin or thick ceramic green sheet 20, could be
further divided into one or more green sheets 24, having a
frame or non-functional area 22, and at least one punched
and/or metallized area 26, comprising electrically conductive material 26. The substrate 25, may also contain non-functional and/or non-metallized area 22, in-between the
metallized area 26. Each of the metallized area 26, may be
similar or different in design. The green ceramic substrate
25, may also contain at least one feature 28, 29, such as, for
example, a location hole 28, an alignment marking 29, to
name a few. The patterns that are formed in the metallized
area 26, are well known to a person skilled in the art.

FIG. 3, illustrates a cross-sectional view taken along
section 3—3 of FIG. 2, showing a stack of at least one
unsintered ceramic green sheet 20, which have been
metallized, aligned, stacked or assembled, and then laminated into a unsintered substrate 25. Basically, the stack of
green sheets 20, comprises of at least one green sheet 24,
with exposed top surfaces 21 and 23, and with a non-metallized area 22. After the stacking of the green sheets 20,
they can be laminated using conventional lamination
techniques, such as, uniaxial lamination.

Figure 4:
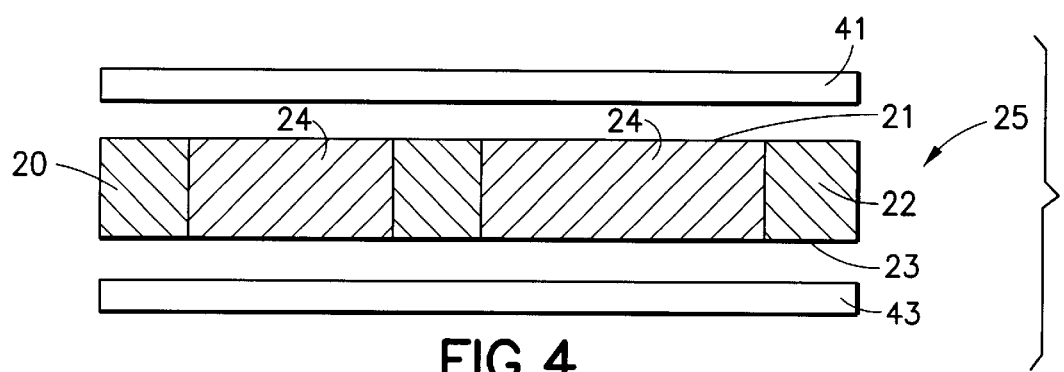
FIG. 4, illustrates the inventive laminate protection layer
readied for positioning on to the unprotected ceramic green
sheet stack.

FIG. 4, illustrates the first step of the inventive process
using the inventive material to eliminate the problem associated with the fusing of the debris 14, 16 and/or 18. The
unsintered green sheet 25, comprising of at least one green
sheet 25, with exposed surfaces 21 and 23, with metallized
area 26, and with or without a non-metallized area 22,
in-between. The green sheet stack 25, is then protected by at
least one top thermally decomposable polymer protective
layer 41, and at least one bottom thermally decomposable
polymer protective layer 43. It is preferred that both the top
protective layer 41, and the bottom protective layer 43,
cover at least a portion of the metallized area 26, of the
ceramic green sheet 20, in order to protect the same from any
debris in subsequent processing. It should be noted that in most cases the debris on the frame or non-metallized area 22, is not fatal or detrimental to the subsequent processing of the substrate 25, however, it is desired that all the surfaces be clear of any debris.

Figure 5:
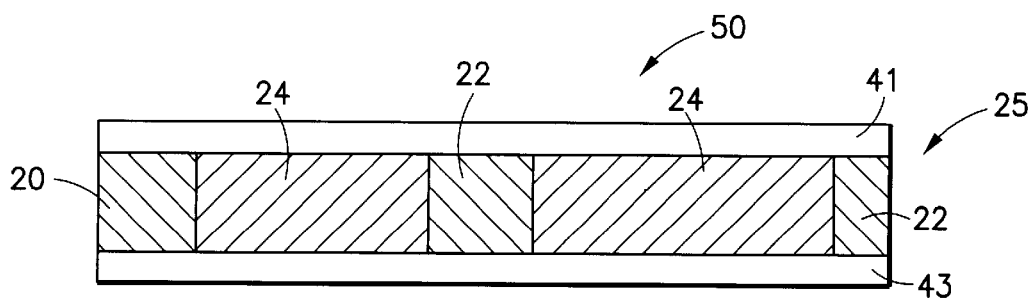
FIG. 5, illustrates the embodiment of this invention where
at least one layer of a thin laminate protective layer is
laminated on to the green ceramic laminate.

FIG. 5, illustrates the laminated structure 50, of stacked green sheets 20, with the top and bottom protective layers 41 and 43. It is preferred that both the top protective layer 41, and the bottom protective layer 43, adhere to the surface 21 and 23, respectively, of the substrate 25, so that the layer 41and/or layer 43, does not delaminate from the metallized area 26, of the ceramic green sheet 20, and continue to protect the same from any debris in subsequent processing. As one can clearly see that the top surface of the protective layer 41, and bottom surface of the protective layer 43, are now exposed in post-lamination operation.

Figure 6:
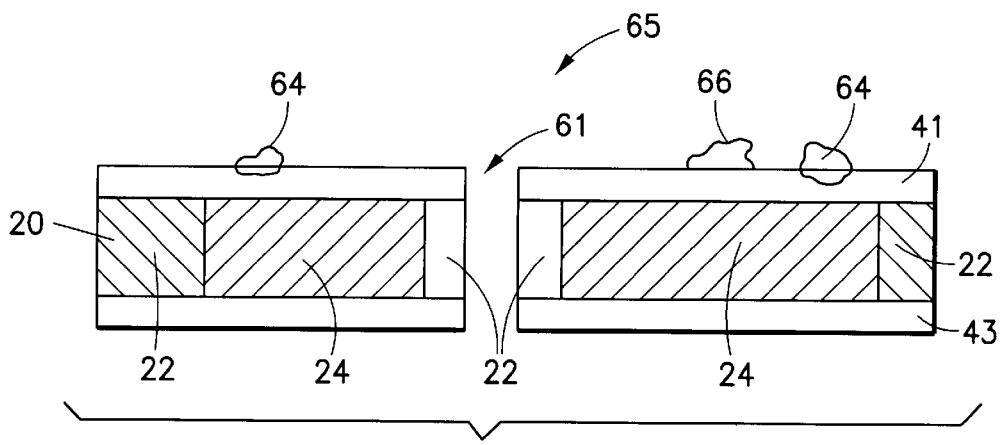
FIG. 6, illustrates the inventive protective layer after
lamination being adhered to and protecting the surface of the
laminate and eliminating the debris fusion problem on green
laminate during operation but prior to sintering.

FIG. 6, illustrates the green sized substrates 65, that were obtained from the laminate 50. During green sizing of the laminate 50, the debris formed and debris 64 and 66, are debris which have settled or lodged onto the surface of the protective layer 41 and/or 43. The debris 64 and/or 66, can now be easily removed from the top surface of the decomposable protective layer 41 and/or 43, by any mechanical means such as, brushing, scraping, machining, etc. However, any debris 64 and/or 66, that cannot be easily removed by the mechanical means can be left behind and any such debris 64 and/or 66, will either get sintered or get dislodged during the subsequent sintering cycle.

Figure 7:
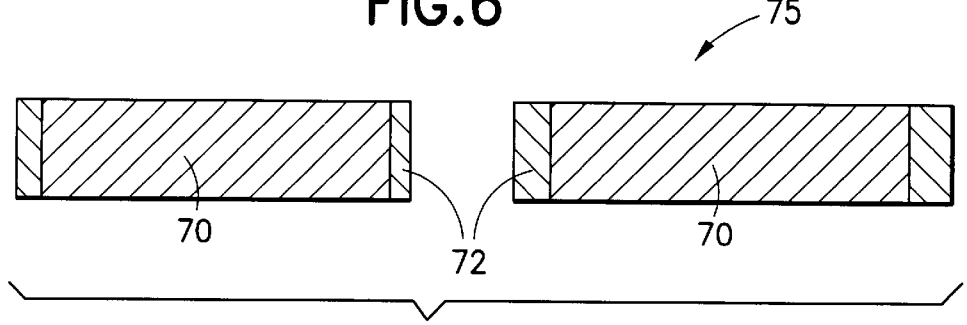
FIG. 7, illustrates the sintered ceramic substrate free of
fused ceramic defects due to the inventive material and
process of this invention.

FIG. 7, illustrates the sintered substrates 75, that is obtained after the protective layer 41 and/or 43, have been thermally decomposed during the sintering cycle in the furnace and/or densifying of the ceramic substrate 75. The non-metallized area or frame 22, would sinter into area 72, which area could be removed or left in place during subsequent operations. As one can fully appreciate that the metallized area 26, was fully protected during the various processes.

The material for the green sheet 10 or 20, is preferably selected from a group comprising alumina, alumina with glass frit, borosilicate glass, aluminum nitride, ceramic, glass ceramic, to name a few. Preparation of ceramic slurry and green sheet casting is carried out by methods well known in the art.

The electrically conductive material 26, that is used for screening the metallurgical patterns 26, is preferably selected from a group comprising copper, molybdenum, nickel, tungsten, metal with glass frit, to name a few. However, the electrically conductive material 26, used for the different layers and/or features could be the same material or it could be a different material. Electrically conductive screening material or paste 26, comprising conductive filler, polymer binder, and solvent carrier could be used and prepared according to methods well known in the art.

The assembled green sheet stack 50, with top and bottom thermally decomposable protective layers 41 and/or 43, should be subjected to the lamination process according to techniques well known in the art, such as, using isostatic pressure, or hydrodynamic or hydraulic pressure. In the case of isostatic pressure lamination, the assembly shown in FIG. 5, may be transferred to an enclosure, and isostatic pressure may be applied by placing the enclosure in a fluid, such as, water or gas (e.g. air or nitrogen). However, care should be taken that the fluid employed does not interact or degrade the enclosure material and/or its contents. Such methods and apparatus are well known in the art, see for example, U.S. Pat. No. 5,746,874 (Natarajan, et al.) and U.S. Pat. No. 5,785,800 (Natarajan, et al.), assigned to International Business Machines Corporations, Armonk, N.Y., and the disclosure of which is incorporated herein by reference. In some lamination processes, the assembly or apparatus could also be heated to say about 75° C., to help facilitate the lamination process.

After the lamination and sizing operations, the laminated structure 65, with protective top and bottom layer 41 and/or 43, would go through a sintering cycle. The thermally decomposable protective layer 41 and/or 43, will be depolymerized and burnt-off early in the sintering cycle, i.e., before the on-set of densification.

The choice of material for the thermally decomposable polymer layer 41 and/or 43, is very important to the present invention. It is preferred that the protective layer 41 and/or 43, be flexible, soft and moldable, and have thermoplastic characteristics with glass transition temperature preferably below the lamination temperature. It is also preferred that the protective layer 41 and/or 43, have a high percentage of Eb (elongation-at-break) and be adherent to the green ceramic surface under the lamination conditions of pressure and temperature. Furthermore, the decomposable layer 41 and/or 43, should be completely depolymerizable thermally below about 1100° C. and preferably below about 550° C. to form low molecular weight species which burn-off without leaving any carbonaceous residue or other detrimental by-products. This decomposable layer 41 and/or 43, should also be tough and tear-resistant during lamination, i.e., it distributes the lamination stress and allows for uniform pressure distribution and not suffer any deformation in the process.

Suitable polymer materials for the surface film 41 and/or 43, as protective and conformable overlay according to this invention, are acrylic polymer derived thermoplastic films comprised of homopolymers, co-polymers, terpolymers, or physical mixtures of polymers derived from methyl acrylate, ethyl acrylate, ethyl methacrylate, butyl methacrylate, acrylic acid, methacrylic acid, isobutylmethacrylate, fluorobutylmethacrylate, and the like. Preferred homopolymers, co-polymers, terpolymers, or physical mixtures thereof according to this inventions have Tg less than about 70° C., with tensile modulus in the range of between about 300 and about 800 N/mm$^2$. The protective layers 41 and/or 43, should have a high tensile strength such that there is no problem of tearing or distortion at the lamination temperature and pressure conditions, including lamination at higher pressures above about 2500 psi and any lamination temperatures from between about 45° C. to about 90° C. It is preferred that the protective layers 41 and/or 43, have a thermal coefficient of expansion (TCE) between about 100 and about 200 ppm/° C. It is also preferred that the protective layers 41 and/or 43, depolymerize and burn-off cleanly during the sintering process and leaves no carbonaceous residue in the sintered ceramic. The acrylic polymer derived films as protective and conformable overlay according to this invention are partially cured (B-stage) or fully cured (C-stage) flexible and thermoplastics films with excellent adhesive bonding characteristics to green sheet under the lamination conditions, and having non-stick surface for flying debris during sizing/dicing operations.

Furthermore, the thickness of the protective layers 41 and/or 43, is also important. It is preferred that the maximum thickness for the thermally decomposable material 41 and/or 43, should be less than about 10 mil, to have high yield in lamination process and high throughput in the sinter furnace.

It should be appreciated that the preferred material(s) for the thermally depolymerizable polymer layer 41 and/or 43, should be acrylate polymers comprising homopolymers, co-polymers, terpolymers, or physical mixtures thereof, derived from the monomers or mixtures thereof, of the type methyl acrylate, ethyl acrylate, ethyl methacrylate, butyl methacrylate, acrylic acid, methacrylic acid, isobutylmethacylate, fluorobutylmethacrylate, and the like. Among these, preferred homopolymers, co-polymers, terpolymers, or physical mixtures thereof useful for the purpose of this invention can be formed from any set or sets of monomers so long as the thermoplastic films derived therefrom have Tg less than about 70° C., preferably in the range of between about 25 to about 65° C., and tensile modulus of between about 300 to about 700 N/mm$^2$, preferably in the range of between about 350 and about 600 N/mm$^2$.

The thermoplastic acrylic polymer films according to this invention have the unique characteristics of (a) adhesive bonding to ceramic laminates during high pressure lamination process which bonding is maintained during sizing and dicing operations providing excellent protection for ceramic and thus minimizing yield loss which otherwise occurs due to defects caused by flying debris landing on the surface of ceramic;

(b) undergo facile depolymerization at high temperature and cleanly burns-off during sintering process conditions leaving no carbonaceous residue on sintered ceramic substrate surface;

(c) acrylic polymer overlay causes no perturbation of the paste screened features in the contacting green sheet with no paste spreading or paste-pull problem;

(d) acrylic polymer films are pre-processed to B-stage or C-stage curing which require no further solvent processing for applications according to this invention;

(e) provide perfectly conformable thermoplastic mask for ceramic green sheets under the lamination pressure and temperature conditions in the production of MLC substrates.

Representative homopolymers, co-polymers, and terpolymers derived from the acrylic monomers according to this invention include: poly(ethyl methacrylate-co-methyl acrylate-co-butyl methacrylate); poly(methyl acrylate-co-methacrylicacid-co-ethyl methacrylate); poly(butylmethacrylate); poly(ethylmethacrylate-methacrylic acid-co-methacrylate); poly(ethylmethacrylate); poly(ethyl acrylate-co-ethylmethacylate-co-methacrylic acid), and the like.

It has been found that the acrylic polymer based adhesive films, typically the adhesive films of the type QL adhesives series and the Pyralux products LF0100, LF0200 and related series of preformed polymer films which are commercially available from DuPont, are among the representative protective and conformable overlay films for the purpose of this invention.

EXAMPLES

The following examples are intended to further illustrate the invention and are not intended to limit the scope of the invention in any manner.

Example 1

Several samples of the multilayer ceramic structures having defect-free surface metallurgical features were fabricated using the process of this invention.

In one sample a stack containing metallized ceramic layers 24, was placed in a lamination frame (not shown). A polyacrylate based thermoplastic adhesive film QL3500 having thickness of about 1–2 mil, was then placed over the top and bottom surface of the stack. The protective adhesive thermoplastic film 41 and/or 43, which had a thickness of about 1–2 mil, was obtained from DuPont and was found to have an elongation of about 200 percent at room temperature.

This assembly was then placed inside a 3 mil thick polyurethane bag (durometer 30 shore A), evacuated and heat sealed. The polyurethane bag, was obtained from Stevens Urethane Film & Sheet, Northampton, Mass., USA. The bag, with its contents were then laminated under pressure to about 5000 psi and at a temperature to about 90° C. in an isostatic press.

After the lamination, the substrate was removed from the bag, and inspected. The protective adhesive film 41 and 43, formed a well bonded surface protective layer on the unfired substrate 50. Significantly, due to the elongation/conformability and the nature of the base material surface, there was no paste-pull/separation under these severe lamination conditions. Furthermore, subsequent sizing operation left no debris bonded onto the protective adhesive film 41 and 43.

The green laminate 50, was then sintered in a sintering furnace by methods well known in the art. During the pyrolysis and binder removal segments of the sinter cycle the acrylic polymer protective layer 41 and/or 43, decomposed completely without leaving any residue in the ceramic body and there was no surface damage to the ceramic substrate 75. Surface analysis by x-ray-photoelectron spectroscopy (XPS) showed absence of any carbon residue attributable to the polymer overlay. Also, Leco carbon analysis was done to test for the carbon residue which showed no evidence of any extraneous residue.

Example 2

In another set of samples the assembly of ceramic layers stack 25, was laminated in a manner described in Example 1, but no thermally depolymerizable surface layer was used. These samples had embedded surface debris and bonded green sizing debris and showed severe paste and ceramic pull by the bag material and also by the lamination plate. This demonstrated the need for the sacrificial protective interface layer 41 and/or 43, and the process of this invention.

Example 3

In another series of samples, different type of polyacrylate based thermally decomposable surface films, LF0100 and LF0200 films of 1–2 mil thickness, commercially available from DuPont as a family of Pyralux products were used. Basically, the assembly of metallized ceramic layers were stacked and placed in the lamination frame, as described in Example 1.

Other polyacrylates derived thermally depolymerizable/decomposable films tried were made of homopolymers, co-polymers, terpolymers, or physical mixtures thereof, of derived from acrylic monomers. The desired characteristics of these decomposable thermoplastic films include a thickness in the range of about 1 mil to about 5 mils and elongation varying between 150 percent to about 550 percent, with elastic modulus being about 0.3 GPa.

The rest of the assembly and the procedure followed was similar to the one explained in Example 1. Again, there was no evidence of fused debris on the metallurgical features and no paste pull-outs was seen, thus it showed that the adhered surface film, protected the screened features and the ceramic. Also, all of the thermally depolymerizable/decomposable layers or films left no residue in subsequent sintering operation.

Example 4

In this example, an assembly of ceramic layers with the protective layers 41 and/or 43, were stacked and laminated in a manner described in Example 1 except that the lamination pressure applied was from a hydraulic press. Lamination occurred at a pressure of about 4,500 psi and at a temperature of about 75° C. Inspection of the laminated structure showed the screened features and the ceramic was protected by the adhered surface film 41 and/or 43, both in lamination and in subsequent green sizing operation.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of protecting an unsintered structure having at least one defect-free surface feature, comprising:

(a) placing at least a portion of at least one thermally depolymerizable/decomposable layer over said surface feature on said unsintered structure, wherein said thermally depolymerizable/decomposable layer has the characteristics of being thermally bondable to at least a portion of said unsintered structure and to at least a portion of said surface feature on said unsintered structure during lamination and being thermally decomposable without leaving any carbonaceous residue during subsequent sintering, and wherein material for said thermally depolymerizable/decomposable layer is selected from the group consisting of poly(ethyl methacrylate-co-methyl acrylate-co-butyl methacrylate), poly(methyl acrylate-co-methacrylic acid-co-ethyl methacrylate), poly(butyl-methacrylate), poly(ethyl methacrylate-methacrylic acid-co-methacrylate), poly(ethyl methacrylate) and poly(ethyl acrylate-co-ethyl methacrylate-co-methacrylic acid); and (b) applying pressure onto at least a portion of said thermally depolymerizable/decomposable layer, such that at least a portion of said thermally depolymerizable/decomposable layer conforms to at least a portion of the surface topography of said surface feature and said unsintered structure, and wherein at least a portion of said thermally depolymerizable/decomposable layer further adheres to at least a portion of the surface of said unsintered structure, and thereby protects said unsintered structure.

2. The method of claim 1, wherein said unsintered structure is a substrate for a semiconductor chip.

3. The method of claim 2, wherein said substrate is selected from the group consisting of ceramic substrate, multi-layer ceramic substrate and glass ceramic substrate.

4. The method of claim 1, wherein said unsintered structure comprises at least two ceramic green sheets and wherein applying pressure causes said at least two ceramic green sheets to become laminated.

5. A method of protecting an unsintered structure having at least one defect-free surface feature, comprising:

(a) placing at least a portion of at least one thermally depolymerizable/decomposable layer over said surface feature on said unsintered structure, wherein said thermally depolymerizable/decomposable layer has the characteristics of being thermally bondable to at least a portion of said unsintered structure and to at least a portion of said surface feature on said unsintered structure during lamination and being thermally decomposable without leaving any carbonaceous residue during subsequent sintering, and wherein said thermally depolymerizable/decomposable layer is selected from a group consisting of QL3500 adhesive films and DuPont Pyralux series of films LF0100, LF0200, and FR0200; and (b) applying pressure onto at least a portion of said thermally depolymerizable/decomposable layer, such that at least a portion of said thermally depolymerizable/decomposable layer conforms to at least a portion of the surface topography of said surface feature and said unsintered structure, and wherein at least a portion of said thermally depolymerizable/decomposable layer further adheres to at least a portion of the surface of said unsintered structure, and thereby protects said unsintered structure.

6. The method of claim 1, wherein said applied lamination pressure is less than about 2500 psi.

7. The method of claim 1, wherein said applied lamination pressure is more than about 2500 psi.

8. The method of claim 1, wherein said step of applying pressure is selected from the group consisting of isostatic pressure, hydrodynamic pressure and hydraulic pressure.

9. The method of claim 1, wherein said at least one unsintered structure and said at least one thermally depolymerizable/decomposable layer are inside at least one environmental enclosure.

10. The method of claim 9, further comprising the step, prior to applying pressure, of evacuating said environmental enclosure so that said environmental enclosure collapses and conforms to said at least one unsintered structure and said at least one thermally depolymerizable/decomposable layer.

11. The method of claim 1, wherein said thermally depolymerizable/decomposable layer is flexible, moldable with glass transition temperature below about 75° C. and has an elongation-at-break (% Eb) above about 150 percent.

12. The method of claim 1, wherein said unsintered structure has at least one alignment hole.

13. The method of claim 1, wherein said unsintered structure has at least one alignment hole and wherein said alignment hole is used to align said unsintered structure with at least one alignment pin.

14. The method of claim 1, wherein said unsintered structure has at least one alignment mark.

15. The method of claim 1, wherein said unsintered structure has at least one alignment mark and wherein said alignment mark is used to align said unsintered structure with at least one alignment pin.

16. The method of claim 1, wherein said unsintered structure and said at least one thermally depolymerizable/decomposable layer are subjected to at least one sintering process.

17. The method of claim 1, wherein said unsintered structure and said at least one thermally depolymerizable/decomposable layer are subjected to at least one sintering process, and the completion of said process results in a sintered structure with no residue from said at least one thermally depolymerizable/decomposable layer.

18. The method of claim 1, wherein said unsintered structure is selected from a group consisting of alumina, alumina with glass frit, borosilicate glass, aluminum nitride, ceramic and glass ceramic.

19. The method of claim 1, wherein material for said surface feature is selected from a group consisting of copper, molybdenum, nickel, tungsten, metal with glass frit, electrically conductive filler and electrically conductive polymer.

* * * * *